United States Patent [19]
Hoang

[11] Patent Number: 6,026,021
[45] Date of Patent: Feb. 15, 2000

[54] SEMICONDUCTOR MEMORY ARRAY PARTITIONED INTO MEMORY BLOCKS AND SUB-BLOCKS AND METHOD OF ADDRESSING

[75] Inventor: Loc B. Hoang, San Jose, Calif.

[73] Assignee: Winbond Electronics Corp. America, Taiwan

[21] Appl. No.: 09/151,460

[22] Filed: Sep. 10, 1998

[51] Int. Cl.[7] .............................. G11C 16/04; G11C 8/00
[52] U.S. Cl. .................................. 365/185.11; 365/230.03
[58] Field of Search .......................... 365/185.11, 185.17, 365/185.23, 185.33, 230.03, 230.06

[56] References Cited

U.S. PATENT DOCUMENTS

| | | | |
|---|---|---|---|
| 5,329,488 | 7/1994 | Hashimoto | 365/230.03 |
| 5,384,743 | 1/1995 | Rony | 365/185.11 |
| 5,621,690 | 4/1997 | Jungroth et al. | 365/185.11 |
| 5,682,350 | 10/1997 | Lee et al. | 365/185.11 |
| 5,777,922 | 7/1998 | Choi et al. | 365/185.33 |
| 5,812,452 | 9/1998 | Hoang | 365/185.11 |
| 5,847,994 | 12/1998 | Motoshima et al. | 365/185.11 |

*Primary Examiner*—Trong Phan
*Attorney, Agent, or Firm*—Claude A. S. Hamrick; Oppenheimer Wolff & Donnelly LLP; Emil C. Chang

[57] ABSTRACT

A memory circuit that reduces memory operation access time and stress on the memory cells due to memory operations. The memory circuit comprises a semiconductor memory array having a continuously addressable memory space being divided into a plurality of memory array blocks; a memory addressing circuit capable of addressing said continuously addressable memory space of said semiconductor memory array; a memory operation circuit for performing a memory operation on a selected memory cell within a selected memory array block among said plurality of memory array blocks; and a switching network responsive to said memory addressing circuit for selectively coupling said memory operation circuit to said selected memory cell of said selected memory array block by way of said conductive lines, for performing said memory operation on said selected memory cell. A method of addressing and performing memory operations on the memory circuit is also provided herein, that includes the steps of addressing a selected memory array block among said plurality of memory array blocks; addressing a selected memory cell within said selected memory array block; performing a memory operation on said selected memory cell; and isolating at least one unselected memory array block from said step of performing said memory operation on said selected memory cell.

22 Claims, 4 Drawing Sheets

SEMICONDUCTOR MEMORY ARRAY PARTITIONED INTO MEMORY BLOCKS AND SUB-BLOCKS AND METHOD OF ADDRESSING

FIELD OF INVENTION

This invention relates generally to semiconductor memory arrays, and in particular, to an apparatus and method for isolating portions of a semiconductor memory array so that improved access time and reduced write disturbance results during memory operations.

BACKGROUND OF THE INVENTION

Semiconductor memory arrays are used extensively in today's digital and computer systems. These memory arrays are mainly used in such systems for storing data and computer programs or instructions which manipulate data to perform specific functions. Some semiconductor memory arrays are volatile; that is, they lose their memory content in response to its source power being cut-off. These volatile semiconductor memory arrays include, for example, static random access memory (SRAM) and dynamic random access memory (DRAM). Other semiconductor memory arrays are non-volatile; that is, they do not lose their memory content in response to its source power being cut-off. These non-volatile memory include, for example, electrically programmable read only memory (EPROM), electrically erasable programmable read only memory (EEPROM), flash EEPROM, and others.

Figure 1:
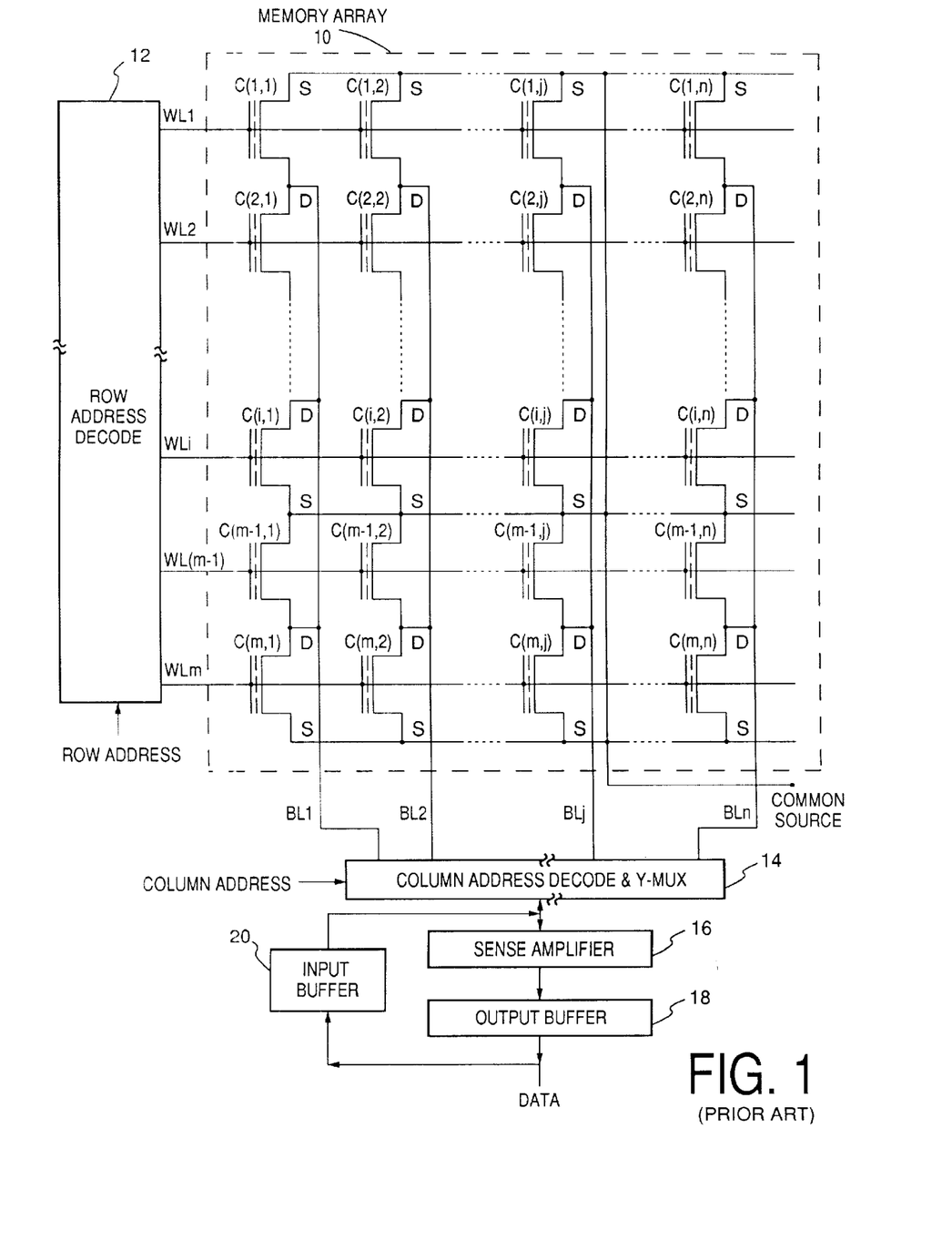
FIG. 1 is a block and schematic diagram of a prior art semiconductor memory array, including associated circuitry for performing memory operations thereto.

Referring initially to FIG. 1, a schematic diagram of typical prior art example of a semiconductor memory array 10 is shown, along with associated circuitry for addressing and performing memory operations. The semiconductor memory array 10 typically comprises a plurality of field effect transistors structurally arranged in an array consisting of rows and columns of transistors. Generally, each transistor in a memory array stores a particular bit of data, and accordingly, the transistors are generally referred to as memory cells. In the typical configuration, the transistors or memory cells forming a column of the semiconductor memory array 10 have their drains electrically connected to each other by a conductive line; typically referred to as the "bitline" or "BL", for short. Also in the typical configuration, the transistors or memory cells forming a row of the semiconductor memory array 10 have their gates connected to each other by another conductive line; typically referred to as the "wordline" or "WL", for short. In some semiconductor memory arrays, all of the transistors or memory cells in the memory array 10 have their sources connected to each other, forming a common source. It is conventional that the drains and sources of the memory cell transistors are interchangeable.

As shown in FIG. 1, the semiconductor memory array 10 contains "m" rows of transistors or memory cells, wherein the variable "i" represents the i'th row. The "i" and "m" variables will also be used in conjunction with "WL" to designate the wordlines connecting in common the gates of the i'th and m'th rows of transistors or cells, respectively. The semiconductor memory array 10 also contains "n" columns of transistors or memory cells wherein the variable "j" represents the j'th column. The "j" and "n" variables will also be used in conjunction with "BL" to designate the bit-lines connecting in common the drains of the j'th and m'th column of transistors or memory cells, respectively. Using these designations, a particular transistor or memory cell in the memory cell can be designated as C(row, column), wherein C(i, j) is the transistor or memory cell in the i'th row and the j'th column.

Typically, a particular transistor or memory cell in the semiconductor memory array 10 is addressed using a row address decoder 12 and a column address decoder 14. The outputs of the row address decoder 12 are coupled to corresponding wordlines (WLI–WLM) of the memory array 10. The row address decoder 12 receives a row address for selecting a particular row of transistors or memory cells for which the desired transistor or cell to be addressed is in. If the semiconductor memory array 10 is comprised of N-type transistors, then the row address decoder 12 produces a logical "high" on the selected wordline. Similarly, outputs of the column address decoder/Y-multiplexer (Y-mux) 14 are coupled to corresponding bit-lines (BLI–BLN) of the memory array 10. The column address decoder 14 receives a column address for selecting a particular column of transistors or memory cells for which the desired transistor or memory cell to be addressed is in. The column address decoder/Y-mux select a bitline to be interfaced or connected to the sense amplifier 16 or the input buffer 20.

By placing logical "highs" on the selected wordline and appropriate bias voltage on the selected bit-line of the selected transistor or memory cell, and more specifically, on the gate and drain of the selected transistor, a determination of whether the cell contains a logical "1" or a logical "0" can be determined by measuring the drain current, designated herein as $I_D$. A sense amplifier 16 is included for sensing the drain current $I_D$. The sense amplifier 16 measures the drain current ID by sensing the voltage at its input, and in particular, the difference in its input voltage between the sensing of a logical "0" and a logical "1". This difference in its input voltage is usually termed the "sense window" and can be designated as $\Delta V$. Therefore, by having the sense amplifier 16 sense its input voltage, the data content of the selected transistor or memory cell can be determined. Output and input buffers 18 and 20 are provided for buffering the data as it is transferred and received.

Because of the recent trend of densifying memory circuits, that is, increasing the content memory size for a given integrated circuit size, semiconductor memory arrays, such as the one shown in FIG. 1, have grown to include a substantial amount of transistors or memory cells. Due to this increase in the semiconductor memory array, the performance and reliability of the memory array has been adversely affected. Specifically, with respect to the performance aspect of the memory array, the memory operation or read access time has increased with the increase in the number of transistors or memory cells of the semiconductor memory array of the type shown in FIG. 1. With respect to performance, the write disturbance or transistor voltage stress is now unnecessarily affecting more transistors or memory cells of the semiconductor memory array of the type shown in FIG. 1, which adversely affects the operational lifetime of the semiconductor memory array.

Specifically, the increase in the read access time of the semiconductor memory array 10 has occurred because more transistors or memory cells in a column of the memory array are coupled to the sense amplifier 16. The read access time, which can be represented as $\Delta T$, is proportional to the sense window voltage $\Delta V$, the capacitance $C_{SA}$ as seen at the input of the sense amplifier 16, and inversely proportional to the read drain/source current ID During a read operation, the column address decoder 14 couples the selected bit-line to the sensing input of the sense amplifier 16, and in particular, couples the drain of each column transistor or memory cell to the sensing input of the sensing amplifier. Because each transistor of the semiconductor memory array has a Parasitic junction capacitance $C_J$ associated with its drain, the increase in the memory array size has resulted in an increase in the capacitance $C_{SA}$ at the sensing amplifier input. Because the read access time is proportional to the capacitance $C_{SA}$, the increase in the number of column transistors has resulted in an increase in the read access time.

For example, the prior art semiconductor memory array 10 of FIG. 1 includes "m" transistors or memory cells within each column. Assuming that each transistor has a Parasitic junction capacitance $C_J$ associated with its drain, then the capacitance contribution from a column of transistors to the input capacitance $C_{SA}$ of the sensing amplifier 16 is given by $mC_J$. If the number of transistors or memory cells in semiconductor memory arrays continues to grow, as it is the trend today, and consequently, the number of column transistors grow (that is, "m" gets larger), then the capacitance contribution from a column of transistors or memory cells $mC_j$ also gets larger, which results in a large capacitance $C_{SA}$ seen at the input of the sense amplifier 16. The read access time, being proportional to the capacitance $C_{SA}$, will also be larger. Thereby, slowing the speed in which the semiconductor memory array can be operated.

From a reliability standpoint, the more denser a semiconductor memory array gets, the more transistors or memory cells of the memory array are unnecessarily exposed to memory operation voltages. Specifically, during a write operation on the semiconductor memory array, which includes programming and erasing operations, a voltage typically around 5 to more than 12 Volts (depending on the type of semiconductor memory array) is applied to the drain of the transistors or memory cells of the memory array by way of the bit-lines. This means that each transistor or memory cell in a column of the memory array will be exposed to such voltage. This applied voltage causes stress of each selected column transistor or memory cell which degrades the operational lifetime of the transistor or memory cell. It also makes each of the column transistors susceptible to program disturbance; that is, their data content may be altered by the applied voltage.

Again, taking the example of the prior art semiconductor memory array of FIG. 1, it includes "m" transistors or memory cells per column of the array. During the write operation, a voltage typically around 5 to 12 Volts is applied to a bit-line of the memory array. This results in "m" column transistors or memory cells being exposed to such applied voltage. Since during the write operation only one transistor is accessed at a time for writing data thereto, a total of m-1 transistors are unnecessarily exposed to the applied voltage. Again, as semiconductor memory arrays get denser, the number of column transistors "m" get larger; which results in more transistors (i.e. m-1) being unnecessarily exposed to the applied voltage. This has the adverse effects of degrading the operational lifetime of the transistors and making them susceptible to program disturbance.

The adverse effects of program disturbance and operational lifetime degradation is more prevalent in semiconductor memory array that uses the common source for performing writing operations. During the writing operation of this type of memory array, a voltage typically ranging from 5 to 12 volts (depending on the type of the semiconductor memory array) is applied to the common source. This results in all transistors or memory cells of the memory array being exposed to such applied source voltage, which degrades the operational lifetime of memory array and makes all transistors or memory cells therein susceptible to write disturbance.

For the source-voltage writing type of semiconductor memory arrays, the adverse effects are worse since more transistors or memory cells are unnecessarily exposed to the applied voltage. Taking the example of the prior art semiconductor memory array 10 of FIG. 1, it comprises an n×m array of transistors or memory cells all having a common source. Since during writing operation only one transistor will be accessed for writing data thereto, this means that a total of (n×m)-1 transistors or memory cells are unnecessarily exposed to such applied source voltage. Because of the trend to increase both n and m in today's design of semiconductor memory arrays, more transistors or memory cells will be unnecessarily exposed to such applied source voltage, which results in the proliferation of the operational lifetime degradation and program disturbance effects.

Thus, there is a need for a semiconductor memory array and associated memory operation circuit that meets today's expectation of providing more transistors or memory cells within a given die size, and provides improved read access time (i.e. improved performance) and reduces the negative effects of operational lifetime degradation and program disturbance (i.e. improved reliability).

OBJECT OF THE INVENTION

Thus, it is a general object of this invention to provide a semiconductor memory circuit and method of addressing and performing memory operations thereon.

It is a particular object of this invention to provide a semiconductor memory circuit and method of addressing and performing memory operations thereon that has improved memory operation access time;

It is yet another object of this invention to provide a semiconductor memory circuit and method of addressing and performing memory operations thereon that reduces stress on memory cells due to memory operations.

It is still another object of this invention to provide a semiconductor memory circuit and method of addressing and performing memory operations thereon that improves the operational lifetime of the memory cells.

It is still another object of this invention to provide a semiconductor memory circuit and method of addressing and performing memory operations thereon that serve the above-mentioned objects without introducing significant complications to the circuit and method.

SUMMARY OF THE INVENTION

The above objects and other objects are accomplished herein by the various aspects of the invention, wherein, briefly a memory circuit is provided herein comprising a semiconductor memory array having a continuously addressable memory space, wherein the semiconductor memory array is divided into a plurality of memory array blocks; each block including a portion of the continuously addressable memory space. Each memory array block comprises a plurality of memory cells, and a plurality of conductive lines coupled to the memory cells for use in addressing and performing memory operations thereon.

The memory circuit further includes a memory addressing circuit capable of addressing the continuously addressable memory space of the semiconductor memory array; and a memory operation circuit for performing a memory operation on a selected memory cell within a selected memory array block among the plurality of memory array blocks.

The memory circuit also includes a switching network responsive to the memory addressing circuit for selectively coupling the memory operation circuit to the selected memory cell of the selected memory array block by way of the conductive lines. The switching network allows for the memory operation circuit to perform memory operations on the selected memory cell, without coupling the memory operation circuit to the other unselected block(s) of the plurality of memory array blocks.

Also provided herein is a method of addressing and performing memory operations on a semiconductor memory array having a continuous addressable memory space. The method comprises the steps of addressing a selected memory array block among the plurality of memory blocks; addressing a selected memory cell within a selected memory array block among the plurality of memory array block; performing a memory operation on the selected memory cell of said selected memory array block; and isolating at least one unselected block from the steps of addressing and performing the memory operation on the selected memory cell.

Another aspect of the invention provided herein is a memory circuit comprising a semiconductor memory array having a continuously addressable memory array space that includes a plurality of memory array blocks each of which includes a memory space comprised of a plurality of memory cells that form a portion of the continuous addressable memory array space of the semiconductor memory array.

This memory circuit further includes a switching network for selecting a particular memory array block among the rest of the memory array blocks so that a memory operation can be performed on a selected memory cell within that particular block.

BRIEF DESCRIPTION OF THE DRAWINGS

The above-mentioned and other objects and features of this invention and manner of attaining them will become apparent, and the invention itself will be understood by reference to the following description of the preferred embodiments of the invention taken in conjunction with the accompanying drawings, wherein.

DETAILED DESCRIPTION OF THE PREFERRED EMBODIMENTS

Figure 2:
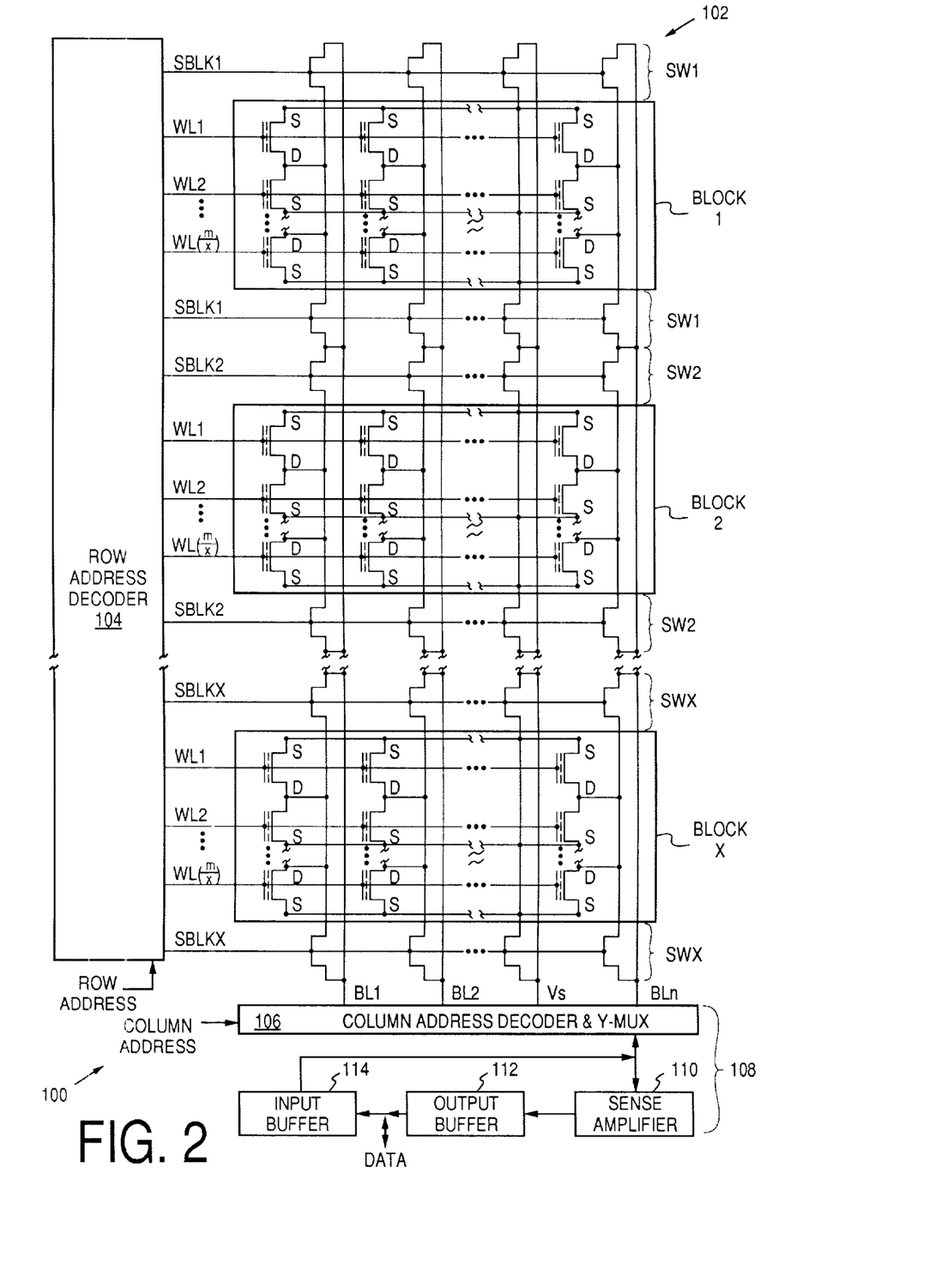
FIG. 2 is a block and schematic diagram of a semiconductor memory circuit as per a first embodiment of the invention.

Referring to FIG. 2, a block and schematic diagram of a memory circuit 100 as an example of an embodiment of the invention is shown. The memory circuit 100 includes a semiconductor memory array 102 having a continuous addressable memory space for storing therein data in the form of logical "1"s and "0"s. The memory circuit 100 further includes a memory addressing circuit coupled to the semiconductor memory array 102 for addressing a selected memory cell within the memory array's continuous memory space for performing thereon a memory operation. In the preferred embodiment, the memory addressing circuit comprises a row address decoder 104 for addressing a row of memory cells containing the selected memory cell and a column address decoder/Y-mux 106 for addressing a column of memory cells containing the selected memory cell, as will be further explained in more detail later. The memory circuit 100 further includes a memory operation circuit 108 coupled to the column address decoder/Y-mux 106 for performing a certain memory operation on the selected memory cell, such as reading, programming and erasing operations. In the preferred embodiment, the memory operation circuit 108 includes a sense amplifier 110, and input and output buffers 112 and 114. The memory operation circuit 108 is also shown as encompassing the column address decoder/Y-mux 106 since it also assists in memory operations, as it is conveniently known.

For achieving the above-mentioned improvements in the memory operation or read access time and in the operational lifetime of the memory circuit, the semiconductor memory array 102 is divided or is comprised of a plurality of memory blocks, represented in FIG. 2 as Blocks 1 through X, for illustrative purposes. Each memory array block (Blocks 1–X) includes a memory space that comprises a portion of the continuous addressable memory space of the semiconductor memory array 102. In other words, the memory space of each memory array block (Blocks 1–X) is a sub-set of the addressable memory space of the semiconductor memory array 102. In the preferred embodiment, the sum of the memory space of the memory array blocks equals the total addressable memory of the semiconductor memory array.

Each block includes a plurality of memory cells that are preferably arranged in an array, including rows and columns of memory cells as it is conventionally known. In the preferred embodiment, a memory cell consists of a field effect transistor including a gate, drain and source. Each memory cell in a row of memory cells are interconnected with each other by a conductive line that connects their gates in common. This conductive line is conventionally known as the wordline, and will be referred to herein as such or "WL" for short. Each memory cell in a column of memory cells are interconnected with each other by another conductive line that connects their drains in common. This conductive line is conventionally known as the bit-line, and will be referred to herein as such or "BL" for short. In the embodiment shown in FIG. 2, the source of each memory cell within a memory array block are connected in common, and it is conventionally referred to as the common source.

For addressing the rows of memory cells of the memory array blocks (Blocks 1–X), the wordlines (WL1–WLm/X) of the memory array blocks are coupled to the outputs of the row address decoder 104. For selecting a particular row of memory cells contained within one of the memory array blocks (Blocks 1–X), a particular row address corresponding to that row of memory cells is received by the row address decoder 104. In response to the received row address, the row address decoder 104 will produce a logical "high" or (1) on the wordline corresponding to the selected row of memory cells, thereby, applying a positive voltage to the gate of each of the memory cells or transistors in that particular row. Also in response to the received row address, the row address decoder 104 will preferably produce a logical "low" or (0) on the other remaining wordlines pertaining to the unselected rows of memory cells in the selected block and all rows of memory cells in unselected blocks, as will be explained in more detail later. For addressing the columns of the memory cells of the memory array blocks (Blocks 1–X), the bit-lines (BL1–BLn) of the memory array blocks are coupled to the outputs of the column address decoder/Y-mux 106, by way of respective switching banks SW1 through SWX whose function will be explained in more detail later. For selecting a particular column of memory cells contained within one of memory arrays (Blocks 1–X), a particular column address corresponding to that column of memory cells is received by the column address decoder/Y-mux 106. In response to the received column address, the column address decoder/Y-mux 106 will produce a logical "high" or (1) on the bit-line corresponding to the selected column of memory cells. Thereby, applying a positive voltage to the drain of each of the memory cells or transistors in that particular column. Also in response to the received column address, the column address decoder/Y-mux 106 will produce a logical "low" or (0) on the other remaining bit-lines pertaining to unselected rows of memory cells of the selected block and unselected blocks.

The common source of the memory cells of each of the memory array blocks (Blocks 1–X) may be all connected to ground, if the semiconductor memory array 102 is of the type that requires a grounded common source. Or, if the semiconductor memory array 102 is of the type that requires an applied voltage on the common source, the common source of each of the memory array blocks (Blocks 1–X) may be coupled to the column address decoder/Y-mux 106 for receiving therefrom the appropriate common source voltage Vs. In the preferred embodiment, the common source of each of the memory array blocks is coupled to the column address decoder/Y-mux 106 by way of the switching banks SW1 through SWX, as will be explained in more detail below.

The memory operation circuit 108 is coupled to and includes the column address decoder/Y-mux 106 for performing memory operations on the selected memory cell addressed by the row and column address decoders 104 and 106. Such memory operations include, for example, erasing, programming and reading. Specifically, when a particular memory cell is selected by the row and column address decoders 104 and 106, that is, by producing logical "highs" or (1s) on its corresponding wordline and bit-line, this will produce a drain current ID to conduct through the selected transistor. Depending on the data state of the selected memory cell or transistor (that is, whether it is a logical (1) or (0), or in the alternative, whether there is a charge present on the memory cell data-containing gate structure), the drain current $I_D$ will vary according to the data state. The sense amplifier 10 will sense the drain current $I_D$ by sensing the sense window voltage $\Delta V$ at its input. A determination can then be made whether the data contained in the selected memory cell is a logical (1) or (0) for output through the output buffer 112. This is the reading memory operation. Programming and erasing can also be performed by addressing the selected memory cell, as it is well known in the art.

For performing the memory operations on memory cells of a selected memory array block, and for isolating the memory operations from memory cells of unselected memory array blocks, the memory circuit 100 includes a switching network (SW) comprised of a plurality of switching banks (SW1–X), with at least one switching bank per memory array block. In the preferred embodiment, there will be two switching banks per memory array block. In the example shown in FIG. 2, switching bank SW1 will be used for selecting Block 1 for performing memory operations on its memory cells; switching banks SW2 will be used for selecting Block 2 for performing memory operations on its memory cells; and so on, to switching banks SWX will be used for selecting Block X for performing memory operations on its memory cells.

Each switching bank includes a plurality of field effect transistors, preferably one for each bit-line in the memory array block. In the preferred embodiment, the drains of the switching bank transistors are coupled to the corresponding bit-line outputs of the column address decoder/Y-mux 106. In the preferred embodiment, the sources of the switching bank transistors are coupled to the bit-lines of the respective memory array blocks. It shall be readily understood, that the source and drain of the switching bank transistors can be interchanged so that the sources are coupled to the column address decoder/Y-mux 106 and the drains are coupled to the bit-lines of the respective memory array blocks. In the preferred embodiment, two switching banks pertaining to a memory array block (such as SW1 to Block 1) are coupled to the memory array block at the bit-line ends of the block. This provides for improved distribution of the drain voltage along the bit-lines during memory operations.

The gates of the switching bank transistors are coupled to the outputs of the row address decoder 104 for selection of the particular memory block containing the memory cell to which a memory operation is to be performed on. The row address decoder 104 preferably has a select block output for each memory array block in the semiconductor memory array 102. For example, select block output SBLK1 is used for selecting Block 1 for performing memory operations on its memory cells; select block output SBLK2 is used for selecting Block 2 for performing memory operations on its memory cells; and so on, to select block output SBLK X which will be used for selecting Block X for performing, memory operations on its memory cells. The most significant bits of the input row address, for example, can be used for selection of the memory array blocks, and the other least significant bits of the input row address can be used for selection of the wordlines. In the preferred embodiment, signal values provided via each of the wordlines are logically AND with signal values provided via the block select lines by logic (not shown) of the row address decoder 104 so that only the selected wordline of the selected block will be a logical "high" or (1), and not the corresponding wordline of the unselected blocks.

In operation, the input row address dictates to the row address decoder 104 to produce a logical "high" or (1) on one of its selected memory block outputs (SBLK 1–X). For example, assume that the input row address dictates that memory array Block 2 is to be the selected block containing the selected memory cell to which a memory operation will be performed on. The logical "high" or (1) on SBLK 2 will cause the switching banks SW2 to couple the column address decoder/Y-mux 106 to the bit-lines of Block 2.

Simultaneously, the input row address dictates to the row address decoder 104 to produce a logical "high" or (1) to one of its wordlines (WL 1-m/X). For example, assume that the input row address dictates that the wordline WL1 pertaining to Block 2 is to be the selected row of memory cells containing the selected memory cell to which a memory operation is to be performed on. The logical "high" or (1) on WL1 will produce a voltage on the gates of the first row of memory cell transistors of Block 2. Thus, enabling that row of memory cell transistors for memory operations.

Simultaneous with the above block and wordline selection operations, an input column address dictates to the column address decoder/Y-mux 106 to produce an applied voltage to a selected bit-line. For example, assume that the input column row address dictates that bit-line BL2 is to be selected. This will cause a voltage to be applied to bit-line BL2 for performing a particular memory operation, such as programming, erasing and reading. The memory operation circuit 108 will then be coupled to bit-line BL2, for example, for performing a reading operation. Since select block line SBLK 2 is logically "high" or (1) causing switching banks SW 2 to couple the column address decoder/Y-mux 106 to the bit-lines of Block 2, the operational voltage on bit-line will be coupled to the selected memory cell in the first row of memory cells of Block 2.

The memory cells of unselected memory array blocks will be isolated from the memory operation performed on Block 2, as described in the previous example. This is because a logical "zero" or (0) will be on all the other select block lines (i.e. SBLK1 and SBLK3 through SBLKX). This produces a low voltage on the gates of the switching bank transistors pertaining to switching banks that correspond to unselected block (i.e., SBLK1 and SW3 through SWX). This results in the transistors of the switching banks of the unselected blocks to be turned off. As a result, the column address decoder/Y-mux 106 and the memory operation circuit 108 are not coupled to unselected blocks. Also, because the row address decoder 104 includes logic (not shown) for executing a logical AND operation between signal values provided via the wordlines WL1–WL(m/X) and signal values provided via the select block lines SBLK 1–SBLKX, the wordlines pertaining to unselected blocks will also be at logical "zero"s (0s). This results in no voltage being applied to unselected memory array blocks, assuming that the type of semiconductor memory array 102 is of the type that requires a grounded common source.

If the semiconductor memory array 102 is of the type that requires an applied common source voltage $V_S$, alternatively, each of the switching banks SW1 through SWX may include an additional switching transistor for selectively coupling the applied common source voltage $V_S$ to the common source of the selected block, without coupling the voltage $V_S$ to the common source of the unselected blocks. As shown in FIG. 2, the column address decoder/Y-mux 106 may be used for providing the applied common source voltage $V_S$. Thus, using the additional common source switching transistor for semiconductor memory arrays of the type that requires an applied common source voltage $V_S$. unselected blocks will have no voltage applied to them during memory operations.

The advantage of isolating unselected memory array blocks from the memory addressing and operation function is that it decreases memory operation or read access time and thus results in improved performance. Another advantage is that it reduces the stress to the memory cells from memory addressing and operation functions since memory cells of unselected blocks are not exposed to memory operation voltages. A further advantage is that less memory cells are susceptible to write or program disturbance.

Consequently, the integrity of the data content and the operational lifetime of the memory cells are improved.

To illustrate the advantages of the memory circuit 100 of the invention as compared to the prior art memory circuit 10 depicted in FIG. 1, consider the following scenario. Assume that the prior art semiconductor memory array 10 comprises an (m×n) memory array, where m is the number of memory cells in a column and n is the number of memory cells in a row. If a reading operation is to be performed on the prior art memory circuit 10, the row and address decoders 12 and 14 will select a row and column common to the selected memory cell to which a reading operation is to be performed on. The column address decode/Y-mux 16 applies a sense voltage on each of the memory cells in the column of memory cells containing the selected memory cell. The column address decode/Y-mux 16 will also couple the input of the sense amplifier 16 to each of the column memory cells.

In the case of the prior art memory circuit 10, "m" column memory cells are exposed to the reading sense voltage and "m" memory cells will contribute its associated junction capacitance $C_J$ to the total capacitance $C_{SA}$ seen at the input of the sense amplifier 16. Since only one memory cell is selected for performing the reading operation thereon, there is a total of m−1 memory cells unnecessarily exposed to the reading sense voltage. Also, since the read access time is proportional to the capacitance $C_{SA}$ seen at the input of the sense amplifier 16, a column of memory cells will proportionally contribute a capacitance of $mC_J$ to the read access time, where $C_J$ is the junction capacitance of each column memory cell transistor.

In contrast, with the memory circuit 100 of the invention, a substantially less amount of memory cells are affected during memory operations, which results in improved read access time, reduced stress on the memory cells, reduced program disturbance and increased operational lifetime of the memory array. To illustrate these advantages, assume that the semiconductor memory array 102 of the invention is of the same memory cell capacity as the prior art memory circuit 10; that is, it has m×n memory cells.

Further assume that the semiconductor memory array 102 of the invention is divided into X equal size memory array blocks (Blocks 1–X) as shown in FIG. 2. In this example, each memory array block has m/X memory cells in a column. Since in the memory circuit 100, the memory operation is performed only on the selected memory array block, and not on the unselected memory array blocks, only m/X memory cells are exposed to memory operation effects. Thus, since only one memory cell is selected for performing a memory peration thereon, m/X−1 memory cells are unnecessarily exposed to the memory operation voltages, as compared to m−1 memory cells for the prior art memory circuit 10. In addition, there is only a time contribution of $(m/X)C_J$ to the read access time, as compared to a time contribution of $mC_J$ for the prior art memory circuit 100.

To quantitatively illustrate the advantages of the memory circuit 100 of the invention, assume that the total number of column memory cells "m" is 1024 (10-bit address), and the semiconductor memory array 100 of the invention has been divided up into 8 memory array blocks (i.e. X=8). Then with the prior art memory circuit 10, there is a total of 1023 memory cells unnecessarily exposed to the stress due to memory operations (i.e. m−1=1024−=1023). Whereas in the memory circuit 100 of the invention, there is only 127 memory cells unnecessarily exposed to the stress due to memory operations (i.e. m/X−1=1024/8−1=127). This statistically results in an improvement of the memory circuit operation lifetime by a factor equal to X; in this example, by a factor of 8. If the partitioning of the memory array is higher, i.e. X is higher, then further improvement in the operational lifetime of the memory circuit results.

With respect to the quantitative improvement on the read access time, the capacitance contribution of the prior art memory circuit 10 to the capacitance $C_{SA}$ seen at the input of the sense amplifier 16 using the prior example is 1024 $C_J$ (i.e. $mC_J$). Thus, the read access time will be affected by an amount proportional to 1024 $C_J$. Whereas in the memory circuit 100 of the invention, the capacitance contribution to the capacitance $C_{SA}$ seen at the input of the sense amplifier 110 is 128 $C_J$ (i.e. m/X $C_J$). Thus, the read access time will only be affected by an amount proportional to 128 $C_J$. This is an improvement over the read access time of the prior art memory circuit by a factor of 8, the amount of equal partitions X. If even better read access time is required, the semiconductor memory array 102 of the invention can simply be subdivided into more memory array blocks (i.e. increase X). Such improvements over the prior art memory circuits are substantial.

Although as shown in FIG. 2, the preferred embodiment of the semiconductor memory array 102 is to partition it into X equally-sized memory array blocks, it shall be understood that the memory blocks need not be partitioned into equally size blocks. They could be partitioned into various size blocks in order to meet the desired implementation required. Thus, the specific partitioning of the semiconductor memory array is not critical to the invention; and thus they are all within the scope of the invention. Also, all the memory array blocks need not be included, but generally it is preferred.

If the semiconductor memory array 102 of the invention is of the type that requires a common source voltage $V_S$ for performing memory operations on its memory cells, then it may be desirable to further breakdown the memory array blocks (Blocks 1–X) into sub-blocks. This is because each of the memory array blocks in the semiconductor memory array 102 of the embodiment shown in FIG. 2 includes a common source for all memory cells in each block. Using the prior example, each block comprises (m/X×n) memory cells which are exposed to the common source voltage $V_S$ during memory operations. Thus, it is desirable to reduce the number of memory cells exposed to the common source voltage $V_S$.

Figure 3:
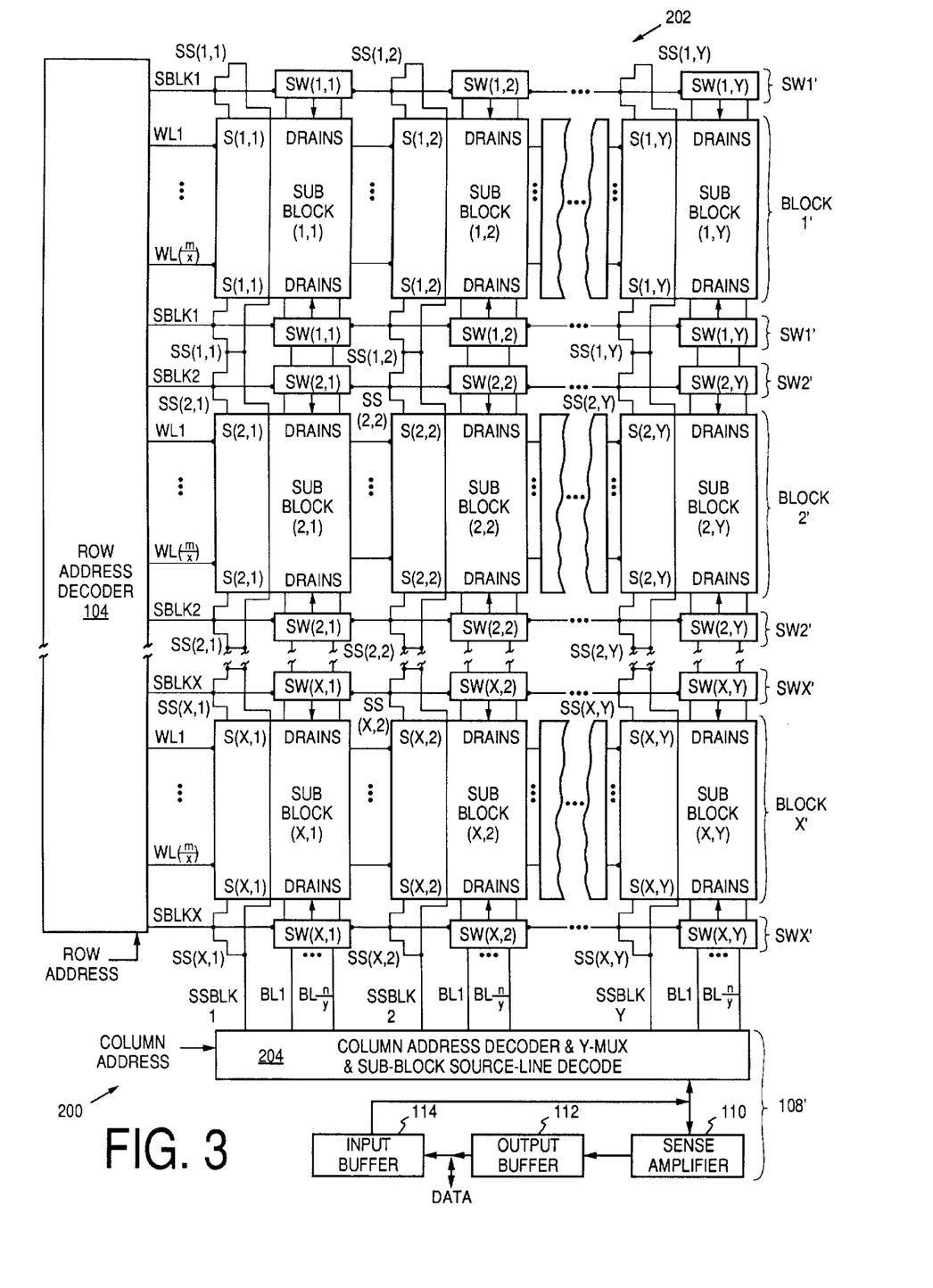
FIG. 3 is a block and schematic diagram of a semiconductor memory circuit as per another embodiment of the invention.

Referring now to FIG. 3, a block and schematic diagram of a memory circuit 200 as per another embodiment of the invention is shown, that addresses the above-mentioned desire to reduce the number of memory cells exposed to the common source voltage $V_S$. Some of the elements of the memory circuit 200 which are preferably identical to elements of the memory circuit 100 of FIG. 2 will have identical reference numbers. Other elements which are preferably modified versions of elements of the memory circuit 100 will use the same reference number, with the addition of a prime, for the sake of simplifying their referencing. Other elements will have a reference number unrelated to elements of the memory circuit 100.

The memory circuit 200 includes a semiconductor memory array 202 preferably having a continuous addressable memory space with a capacity, for illustrative purposes only, of (m×n) total memory cells, where m is the total number of memory cells in a column and n is the total number of memory cells in a row of the array. The semiconductor memory array 202 is partitioned into a plurality of memory array blocks (Blocks 1'–X') preferably of equal memory space size, and with a capacity, for illustrative purposes only, of (m/X×n), where m/X is the number of memory cells in a column within a block, and n is the number of memory cells in a row within a block. Each memory array block comprises a memory space that is a portion or sub-set of the continuous memory space of the semiconductor memory array 202. In the preferred embodiment, the sum of the memory space of each memory array blocks (Blocks 1'–X') equals the continuous addressable memory space of the semiconductor memory array 202.

Similar to the memory circuit 100 of the previous-shown embodiment of the invention, each memory array block (Blocks 1' through X') are preferably formed of a plurality of memory cells, preferably field effect transistors, arranged in rows and columns. A plurality of conductive lines connect in common the gates of respective rows of memory cell transistors of each memory array block, and are typically referred to as wordlines. Another plurality of conductive lines connect in common the drains of respective columns of memory cell transistors of each memory array block, and are typically referred to as bit-lines. In the example embodiment shown in FIG. 3, there are an amount of m/X wordlines for each memory array block designated as WL1 through WL(m/X), and there are an amount of n bit-lines for each memory array block.

The memory circuit 200 further includes a row address decoder 104, such as the one disclosed in the memory circuit 100 of the previous embodiment, for addressing or selecting a memory array block and for addressing and selecting a row of memory cells within the selected memory array block. The memory circuit also includes a column address decoder and Y-mux 204 for addressing or selecting a particular bit-line within the selected block, and for assisting with memory operations and coupling the memory operation circuit 108' to the selected memory cell for performing a memory operation thereon.

The memory circuit 200 further includes a switching network (SW') comprised of a plurality of switching banks SW1' through SWX' used in conjunction with the row and column address decoders 104 and 204 for addressing or selecting the memory array blocks (Blocks 1'–X'), and for addressing and selecting memory array sub-blocks, as will be explained in more detail later. There is at least one switching bank used for selection of a particular memory array block, preferably two. In the example shown in FIG. 3, switching banks SW1' are used for selecting Block 1', switching banks SW2' are used for selecting Block 2', and so on, to switching banks X' which are used for selecting Block X'.

Each of the switching banks SW1' through SWX' preferably includes a plurality of switching field effect transistors whose gates are coupled to a corresponding select block output of the row address decoder. That is, select block output SBLK1 is coupled to the gates of the transistors pertaining to switching banks SW1', select block output SBLK2 is coupled to the gates of the transistors pertaining to switching banks SW2' and so on, to select block output SBLKX is coupled to the gates of the transistors pertaining to switching banks SWX'. Each of the switching banks SW1' through SWX' includes a plurality of sub-switching banks of transistors designated as SW(1,1) through SW(X, Y) used for coupling the column address decoder/Y-mux 204 and the memory operation circuit 108' to the bit-lines of the memory array blocks (Blocks 1'–X').

The memory circuit 200 departs from the memory circuit 100 in that the memory array blocks (Blocks 1' through Block X') include a plurality of sub-blocks each having, their own respective common source and respective bit-lines. However, in the preferred embodiment, the sub-blocks pertaining to a particular block will have common wordlines. The sub-blocks are designated as Sub-Blocks (1,1–Y) that are within Block 1, Sub-Blocks(2, 1–Y) that are within to Block 2, and so on, to Sub-Block(X, 1–Y) that are within Block X'. Since the wordlines of the sub-blocks that are within a particular Block are common, for addressing a row of memory cells, the wordline select outputs of the row address decoder are coupled to each of the wordlines (WL1-m/X) of each of the memory array blocks. The sub-switching banks SW(1,1) through (X,Y) couple the column address decoder/Y-mux 204 to the bit-lines of Sub-Blocks (1,1) through (X, Y), respectively.

The switching banks SW1'–X' each further include a switching field effect transistor for coupling the column address decoder/Y-mux 204 to the common source of each sub-block for applying thereto the common source voltage $V_S$. These switching transistors are designated as SS(1,1) through SS(X, Y), wherein source switching transistors SS(1,1) through SS(1,Y) are used for applying the common source voltage Vs to Sub-Blocks (1,1) through (1,Y), respectively; source switching transistors SS(2,1) through SS(2,Y) are used for applying the common source voltage $V_S$ to Sub-Blocks (2,1) through (2,Y), respectively; and so on, to source switching transistors SS(X, 1–Y) that are use for applying the common source voltage Vs to Sub-Blocks (X,1) through (X,Y), respectively. The gates of the common source switching transistors pertaining to sub-blocks within a particular block are driven by the corresponding select block output SBLK pertaining to the block; such as, select block output SBLK1 drives the gates of source switching transistors SS(l, 1–Y), select block output SBLK2 drives the gates of source switching transistors SS(2,1) through SS(2, Y), and so on, to select block output SBLKX which drives the gates of source switching transistors SS(X, 1–Y).

In addition to providing the memory operation voltages to the bit-lines, in the preferred embodiment, the column address decoder/Y-mux 204 also provides the common source voltage for each of the sub-blocks, along common source voltages lines SSBLK1 through SSBLKY. Preferably, the common source voltage line SSBLK1 is coupled to the common sources of Sub-Blocks (1,2) through (X,2) by way of switching transistors SS(1–X, 1), respectively; common source voltage line SSBLK 2 is coupled to the common sources of Sub-Blocks (1,2) through (X,2) by way of switching transistors SS(1,2) through SS(X,2), respectively; and so on, to common source voltage line SSBLKY line is coupled to the common sources of Sub-Blocks (1,Y) through (X,Y)by way of switching transistors SS(1,Y) through SS(X,Y), respectively. Preferably, signal values provided via the common source voltage lines SSBLK1 through SSBLK1Y are logically AND with signal values provided via the corresponding set of bit lines BL1 through BL(n/Y) by logic (not shown) of the column address decoder 204 are logically AND with corresponding set of bit-lines BL1-n/Y so that only the selected bit-line of the selected sub-block is on, and not the corresponding bit-line of other unselected sub-blocks.

In operation, an input row address dictates to the row address decoder 104 to produce a logical "high" or (1) to one of its selected memory block outputs SBLK1 through SBLKX. For example, assume that the input row address dictates that memory array Block 2 is to be the selected block containing the selected memory cell to which a memory operation is to be performed on. The logical "high" or (1) on SBLK 2 causes the switching banks SW2' to couple the column address decoder/Y-mux 204 to the bit-lines of Block 2 and to the common sources of Sub-Blocks (2,1) through (2,Y) of Block 2.

Simultaneously, the input row address dictates to the row address decoder 104 to produce a logical "high" or (1) to one of its wordlines (WL1-m/X). For example, assume that the input row address dictates that the wordline WL1 pertaining to Block 2 is to be the selected row of memory cells containing the selected memory cell to which a memory operation is to be performed on. The logical "high" or (1) on WL1 will produce a voltage on the gates of the first row of memory cell transistors of Block 2. Thus, enabling that row of memory cell transistors for memory operation.

Simultaneous with the above block and wordline selection operations, an input column address dictates to the column address decoder/Y-mux 204 to produce an applied voltage to one of the bit-lines BL1 through BL (n/Y) and one of the common source line SSBLK1 through SBBLKY. For example, assume that the input column row address dictates that bit-line BL2 and common source line SSBLK 1 are to be selected. This will cause a voltage to be applied to bit-line BL2 and to common source line SSBLK 1 for performing a particular memory operation, such as programming, erasing and reading. The memory operation circuit 108 will then be coupled to bit-line BL2 and common source line SSBLK 1, for example, for performing a reading operation or other type of operation. Since select block line SBLK 2 is logically "high" or (1) causing switching banks SW2' to couple the column address decoder/Y-mux 204 to the bit-lines of Block 2' and to the common sources (2,1) of sub-block (2,1), the operational voltage on bit-line 2 and common source line SSBLK1 will be coupled to the selected memory cell in the first row of memory cells in Sub-Block (2, 1) of Block 2'.

During the selection of the selected memory cell, the memory cells of unselected sub-blocks are isolated from the memory operation performed on Sub-Block (2,1) as described in the previous example. This is because a logical "zero" or (0) will be on all the other select block lines (i.e. SBLK 1, and SBLK 5 through SBLK X). This produces a low voltage on the gates of the switching bank transistors pertaining to switching banks that correspond to unselected block (i.e. SW1' and SW 3'–X'). This results in the transistors of the switching banks of the unselected blocks to be turned off. As a result, the column address decoder/Y-mux 204 and the memory operation circuit 108 are not coupled to unselected blocks. Also, since signals provided via the wordlines WL1 through WL(m/X) are logically AND with corresponding signals provided via the select block lines SBLK1 through SBLKX, the wordlines pertaining to unselected blocks will also be at a logical "zero" (0). In addition, since the signal values provided via the bit-lines BL1 through BL(n/Y) are logically AND with corresponding signal values provided via the common source lines SSBLK1 through SSBLKY the common source lines and the bit-lines pertaining to unselected sub-blocks will also be at a logical "zero" (0). This results in no voltage being applied to the memory cells of unselected sub-blocks.

The advantages of the memory circuit 200 of the invention over the prior art memory circuit 100 are significant in the area of improved memory operation access time, reduction in the stress of memory cells due to memory operations improved operational lifetime of the memory circuit, and reduction of program disturbance, as previously discussed with respect to the memory circuit 100 of the other embodiment of the invention.

In the memory circuit 200 of the embodiment shown in FIG. 3, the common source of unselected sub-blocks are floating. This is because the source switching transistors (i.e. SS(1,1) through SS(X,Y)) of unselected sub-blocks are in their open state. Thus, the common source of unselected sub-blocks are not coupled to the column address decoder/Y-mux 204; thereby, leaving them floating. For certain types of semiconductor memory arrays, leaving the common source open may cause problems. Such problems may include capacitively coupling voltages to common source of unselected blocks from voltages riding on other parts of the semiconductor memory arrays. This may result in cross-talk problems which may adversely affect the memory operation and data content of the semiconductor memory array.

Figure 4:
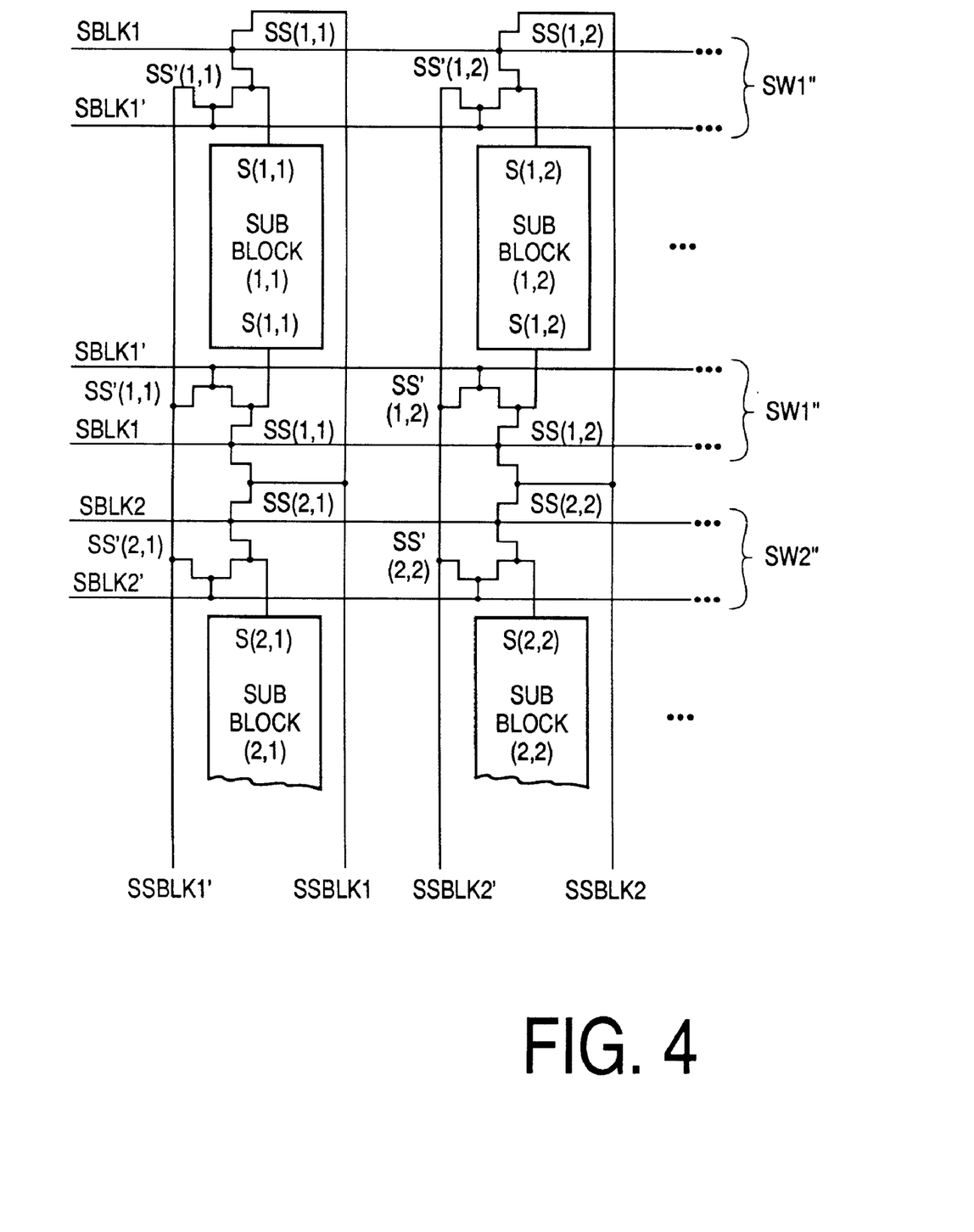
FIG. 4 is a block and schematic diagram of a portion of a semiconductor memory circuit as per yet another embodiment of the invention.

Referring to FIG. 4, a schematic diagram of a switching network SW''' as per another aspect of the invention is shown, which is useful for the memory circuit 200 of FIG. 3, and addresses the problem of the floating common source of unselected blocks. Only a portion of the memory circuit 200 is shown to illustrate the features of the switching network SW". Specifically, only sub-blocks (1,1) through (2,2) are shown.

The switching network SW" differs from the switching network SW' of FIG. 3 in that each switching bank includes an additional source switching transistor for each sub-block. These additional source switching transistors are designated in FIG. 4 as SS'(1,1) through SS'(2, 2) and correspond to Sub-Blocks (1,1) through (2,2) respectively. One terminal of the additional source transistor, either a drain or source, is coupled to the common source input of its corresponding sub-block. The opposite terminal of the additional source transistor, either a source or drain, is preferably coupled to the logical NOT of the common source line outputs of the column address decoder/Y-mux 204 pertaining to that sub-block. The gate of the additional source transistor is coupled to the logical NOT of the select block output corresponding to the block that includes that sub-block.

For instance, the additional source switching transistor SS'(1,1) includes a drain terminal coupled to the common source input S(1,1) of sub-block (1,1). The transistor SS'(1, 1) includes a drain coupled to the logical NOT of common source line SSBLK1, i.e. SSBLK1. The gate of transistor SS'(1,1) is coupled to the NOT of select block line SBLK1 i.e. SBLK1.

In operation, when the selected memory cell is not in Sub-Block(1,1), for example, the select block line SBLK1 is at a logical "low" or (0) state. This causes source switching transistor SS(1,1) to turn off, and does not couple the common source line SSBLK1 to the common source input S(1,1) of Sub-Block (1,1) so that the source voltage Vs is not applied to the memory cells of that sub-block. Simultaneously, the NOT of the select block SBLK1', i.e. SBLK1, is at a logical "high" or (1) state. This causes the additional source transistor SS'(1,1) to turn on, thereby coupling the NOT of the common source line SSBLK1, i.e. SSBLK1 to the common source input S(1,1) of the Sub-Block (1,1). If the NOT common source line SSBLK1 is at a fixed voltage or preferably at ground potential, then the common source of Sub-Block (1,1) is not floating. Using the additional common source transistors SS'(1,1) through SS' (X, Y) for all sub-blocks in memory circuit 200, results in the unselected sub-blocks having their common sources at a fixed voltage, or preferably grounded. This alleviates any problems that may be associated with a floating common source.

Although the present invention has been described in detail with regarding the exemplary embodiments and drawings thereof, it should be apparent to those skilled in the art that various adaptations and modifications of the present invention may be accomplished without departing from the spirit and scope of the invention. Accordingly, the invention is not limited to the precise embodiment shown in the drawings and described in detail hereinabove.

It is claimed:

1. A memory circuit comprising:
   a semiconductor memory array having a continuously addressable memory space, said memory array being divided into a plurality of memory array blocks, each block including a portion of said continuously addressable memory space comprised of a plurality of memory cells, each block further including a plurality of conductive lines coupled to said memory cells for use in addressing and performing memory operations thereon, each of said blocks being segmented into a plurality of sub-blocks each including a portion of said cells of said block, each of said sub-blocks including a corresponding common conductive line coupled to each memory cell within said sub-block;

a memory addressing circuit for addressing said continuously addressable memory space of said semiconductor memory array;

a memory operation circuit for performing a memory operation on a selected memory cell within a selected one of said sub-blocks of a selected one of said blocks; and a switching network responsive to said memory addressing circuit for selectively coupling said memory operation circuit to said selected memory cell of said selected sub-block by way of said conductive lines for performing said memory operation on said selected memory cell, and for selectively coupling said common conductive line of said selected sub-block to an applied common voltage source.

2. The memory circuit of claim 1, wherein said plurality of conductive lines of each memory array block includes a first set of conductive lines each coupled to a corresponding row of memory cells, and a second set of conductive lines each coupled to a corresponding column of memory cells, and wherein said memory addressing circuit includes a first decoder coupled to said first set of conductive lines of each block for addressing a selected row of memory cells in said selected block that includes said selected memory cell, and a second decoder coupled to said second set of conductive lines of each block for addressing a selected column of memory cells in said selected block that includes said selected memory cell.

3. The memory circuit of claim 2, wherein said first decoder is coupled to said switching network for selectively causing said switching network to couple said memory operation circuit to said selected memory cell by way of at least one line of said second set of conductive lines of said selected block.

4. The memory circuit of claim 1, wherein said applied common voltage source is provided by said memory operation circuit.

5. The memory circuit of claim 1, wherein said applied common voltage source is provided by said memory operation circuit, and wherein said memory addressing circuit includes a first decoder coupled to said switching network for selectively causing said switching network to couple said applied common voltage source from said memory operation circuit to said common conductive line of said selected sub-block.

6. The memory circuit of claim 1, wherein said switching network is responsive to said memory addressing circuit for selectively coupling said memory operation circuit to said selected memory cell of said selected sub-block within said selected block by way of said common conductive line of said selected sub-block.

7. The memory circuit of claim 6, wherein the switching network includes a portion thereof coupled to a fixed voltage potential for applying said fixed voltage potential to the common conductive lines of at least one unselected sub-block.

8. The memory circuit of claim 1, wherein the switching network does not couple said memory operation circuit to at least one unselected block among said plurality of memory array blocks.

9. A method of addressing and performing memory operations on a semiconductor memory array having a continuous addressable memory space, said array being partitioned into a plurality of memory array blocks, each of said blocks including a sub-memory space forming a portion of said memory space, each of said blocks being segmented into a plurality of sub-blocks each including a portion of said cells of said block, each of said sub-blocks including a corresponding common conductive line coupled to each memory cell within said sub-block, a memory operation circuit, and a switching network operative to selectively couple said memory operation circuit to a selected memory cell within a selected one of said blocks via said conductive lines for performing a memory operation on said selected memory cell, the switching network being further operative to selectively couple said common conductive line of said selected sub-block to an applied common voltage source, the method comprising the steps of:

addressing a selected memory array block among said plurality of memory array blocks;

addressing a selected one of said memory array sub-blocks; addressing a selected memory cell within said selected memory array sub-block;

performing a memory operation on said selected memory cell; and isolating the common conductive line of at least one unselected memory array sub-block from said applied common voltage source during execution of said step of performing said memory operation on said selected memory cell.

10. The method of claim 9, wherein the step of addressing a selected memory array block includes operating the switching network.

11. The method of claim 9, further including the step of addressing memory array sub-blocks within each of said plurality of memory array blocks for addressing a selected sub-block that includes said selected memory cell.

12. The method of claim 11, further including the step of isolating unselected memory array sub-blocks from said applied common voltage source during execution of the step of performing said memory operation on said selected memory cell.

13. A memory circuit comprising:

a semiconductor memory array having a continuously addressable memory array space that includes a plurality of memory array blocks each of which includes a memory space comprised of a plurality of memory cells that form a portion of said memory array space, each of said blocks being segmented into a plurality of sub-blocks each including a portion of said cells of said block, each of said sub-blocks including a corresponding common conductive line coupled to each memory cell within said sub-block; and a switching network for selecting a selected memory array sub-block among said plurality of memory array sub-blocks so that a memory operation can be performed on a selected memory cell within said selected memory array sub-block, and for selectively coupling said common conductive line of said selected sub-block to an applied common voltage source.

14. The memory circuit of claim 13, wherein the switching network is capable of isolating a common conductive line of at least one unselected memory array sub-block from said applied common voltage source.

15. The memory circuit of claim 14, wherein said switching network includes a plurality of switching banks, each of said switching banks being coupled to a corresponding one of said blocks for selectively allowing said memory operation to be performed on the memory cells of said corresponding block, each of said switching banks including a plurality of sub-switching banks each being associated with a corresponding one of said sub-blocks, each of said sub-switching banks providing for selectively isolating the memory cells of said corresponding sub-block from having a memory operation performed thereon.

16. The memory circuit of claim 14, wherein each memory array block includes a plurality of memory array sub-blocks, and wherein said switching network is capable of selecting a selected sub-block containing said selected memory cell for performing said memory operation thereon.

17. The memory circuit of claim 16, wherein said switching network is capable of isolating at least one unselected memory array sub-block from having said memory operation performed on its memory cells.

18. A memory circuit comprising:

a semiconductor array of memory cells organized in rows and columns, said array including a plurality of word lines each being coupled to each cell of a corresponding one of said rows, said array being divided into a plurality of array blocks each including a corresponding set of said rows, each of said blocks being divided into a plurality of sub-blocks each including a portion of said cells of said corresponding block, each of said sub-blocks also including a corresponding common conductor line coupled to each cell of said sub-block, and a corresponding plurality of bit lines, each of said bit lines being coupled to each cell of a corresponding column of said sub-block;

a memory addressing circuit for addressing a selected one of said cells of said array, said addressing circuit including, a row decoder coupled to said word lines, said row decoder being responsive to an input row address and operative to generate block select signals for selecting a corresponding one of said blocks, said row decoder also being operative to provide row select signals to corresponding ones of said word lines for selecting corresponding ones of said rows of said selected block, and a column decoder responsive to an input column address and having a plurality of common source outputs, said column decoder being operative to provide a common source voltage signal via a selected one of said common source outputs for selecting one of said sub-blocks, said column decoder also being operative to provide a plurality of column select signals for selecting one of said columns of said selected sub-block;

a memory operation circuit for performing a memory operation on said selected cell; and a switching network coupled to said row decoder and said column decoder, and being responsive to said block select signals, said network being operative to selectively couple said memory operation circuit to said selected cell, and also being operative to selectively couple said common source voltage signal provided via said selected common source output to said common conductive line of said selected sub-block.

19. A memory circuit as recited in claim 18 wherein said switching network includes a plurality of switching banks each being associated with a corresponding one of said blocks, each of said switching banks comprising a plurality of sub-switching banks each being associated with a corresponding one of said sub-blocks, each of said sub-switching banks for selectively coupling said column decoder and said memory operation circuit to bit lines of said corresponding sub-block, each of said sub-switching banks including a plurality of switching bank transistors each being associated with a corresponding column of said corresponding sub-block, each of said bank transistors including:

a first terminal coupled to receive a corresponding one of said column select signals from said column decoder;

a second terminal coupled to said bit line of said corresponding column of said corresponding sub-block; and a control gate coupled to receive a corresponding one of said block select signals from said row decoder.

20. A memory circuit as recited in claim 19 wherein each of said switching banks further comprises a plurality of common source switching transistors each being associated with a corresponding one of said sub-blocks, each of said common source switching transistors including:

a gate coupled to receive a corresponding one of said block select signals from said row decoder;

a first terminal coupled to said common conductor line of said corresponding sub-block; and a second terminal coupled to a corresponding one of said common source outputs of said column decoder.

21. A memory circuit as recited in claim 18 wherein:

said column decoder is further operative to generate a plurality of low common source voltage signals each being associated with a corresponding one of said common source voltage signals, each of said low common source voltage signals carrying a value that is the logical inverse of the value carried by said corresponding common source voltage signal;

said row decoder is further operative to generate a plurality of inverted block select signals each being associated with a corresponding one of said block select signals, each of said inverted block select signals carrying a value that is the logical inverse of the value carried by said corresponding block select signal; and each of said switching banks further includes a plurality of additional source switching transistors each being associated with a corresponding one of said common source switching transistors, each of said additional source switching transistors including, a gate coupled to receive a corresponding one of said inverted block select signals from said row decoder, a first terminal coupled to said common conductor line of said corresponding sub-block, and a second terminal coupled to receive a corresponding one of said low common source voltage signals.

22. A memory circuit as recited in claim 20 wherein each of said sub-blocks has two of said common source switching transistors associated therewith.

* * * * *